United States Patent
Ghyselen et al.

(10) Patent No.: US 11,600,766 B2
(45) Date of Patent: Mar. 7, 2023

(54) METHOD FOR MANUFACTURING A MONOCRYSTALLINE PIEZOELECTRIC LAYER

(71) Applicant: Soitec, Bernin (FR)

(72) Inventors: Bruno Ghyselen, Seyssinet (FR); Ionut Radu, Crolles (FR); Jean-Marc Bethoux, La Buisse (FR)

(73) Assignee: Soitec, Bernin (FR)

( * ) Notice: Subject to any disclaimer, the term of this patent is extended or adjusted under 35 U.S.C. 154(b) by 1167 days.

(21) Appl. No.: 16/064,420

(22) PCT Filed: Dec. 21, 2016

(86) PCT No.: PCT/EP2016/082259
§ 371 (c)(1),
(2) Date: Jul. 6, 2018

(87) PCT Pub. No.: WO2017/109005
PCT Pub. Date: Jun. 29, 2017

(65) Prior Publication Data
US 2019/0006577 A1   Jan. 3, 2019

(30) Foreign Application Priority Data

Dec. 22, 2015 (FR) ...................... 1563057

(51) Int. Cl.
*H01L 41/312* (2013.01)
*H01L 41/319* (2013.01)
(Continued)

(52) U.S. Cl.
CPC ........ *H01L 41/1873* (2013.01); *C30B 25/186* (2013.01); *C30B 29/22* (2013.01);
(Continued)

(58) Field of Classification Search
CPC ... H01L 41/319; H01L 41/0815; H01L 41/09; H01L 41/1873; H01L 41/312;
(Continued)

(56) References Cited

U.S. PATENT DOCUMENTS

| 4,019,200 A | 4/1977 | Adkins et al. |
| 5,935,641 A * | 8/1999 | Beam, III ............. H01L 41/319 204/192.18 |

(Continued)

FOREIGN PATENT DOCUMENTS

| CN | 1139840 A | 1/1997 |
| CN | 1291349 A | 4/2001 |

(Continued)

OTHER PUBLICATIONS

International Search Report for International Application No. PCT/EP2016/082259 dated Jan. 26, 2017, 2 pages.
(Continued)

*Primary Examiner* — A. Dexter Tugbang
(74) *Attorney, Agent, or Firm* — TraskBritt

(57) ABSTRACT

A method for manufacturing a monocrystalline piezoelectric material layer includes providing a donor substrate made of the piezoelectric material, providing a receiving substrate, transferring a so-called "seed layer" of the donor substrate onto the receiving substrate, and using epitaxy of the piezoelectric material on the seed layer until the desired thickness for the monocrystalline piezoelectric layer is obtained.

12 Claims, 4 Drawing Sheets

(51) Int. Cl.
H03H 3/02 (2006.01)
H01L 41/187 (2006.01)
C30B 25/18 (2006.01)
C30B 29/22 (2006.01)
H01L 41/08 (2006.01)
H01L 41/09 (2006.01)
H01L 41/335 (2013.01)
H03H 3/08 (2006.01)
H03H 9/25 (2006.01)
H03H 9/54 (2006.01)
H03H 9/64 (2006.01)
H01L 41/316 (2013.01)
C30B 29/30 (2006.01)

(52) U.S. Cl.
CPC .......... H01L 41/0815 (2013.01); H01L 41/09 (2013.01); H01L 41/312 (2013.01); H01L 41/319 (2013.01); H01L 41/335 (2013.01); H03H 3/02 (2013.01); H03H 3/08 (2013.01); H03H 9/25 (2013.01); H03H 9/54 (2013.01); H03H 9/64 (2013.01); C30B 29/30 (2013.01); H01L 41/316 (2013.01)

(58) Field of Classification Search
CPC ... H01L 41/316; H01L 41/335; C30B 25/186; C30B 29/22; C30B 29/30; H03H 3/02; H03H 3/08; H03H 9/25; H03H 9/54; H03H 9/64
See application file for complete search history.

(56) References Cited

U.S. PATENT DOCUMENTS

| | | | |
|---|---|---|---|
| 6,540,827 | B1 | 4/2003 | Levy et al. |
| 6,593,212 | B1 | 7/2003 | Kub et al. |
| 2003/0199105 | A1 | 10/2003 | Kub et al. |
| 2004/0226162 | A1* | 11/2004 | Miura ............... H03H 3/08 29/595 |
| 2008/0284541 | A1 | 11/2008 | Chitnis |
| 2010/0088868 | A1 | 4/2010 | Kando et al. |
| 2010/0141086 | A1 | 6/2010 | Suzuki et al. |
| 2013/0234564 | A1 | 9/2013 | Sakashita et al. |
| 2014/0339962 | A1* | 11/2014 | Furukawa ......... H01L 41/1873 310/363 |
| 2015/0243549 | A1 | 8/2015 | Letertre et al. |

FOREIGN PATENT DOCUMENTS

| | | | |
|---|---|---|---|
| CN | 1708843 | A | 12/2005 |
| CN | 102253451 | A | 11/2011 |
| EP | 2738939 | A1 | 6/2014 |
| JP | 2001-285019 | A | 10/2001 |
| JP | 2007281238 | A * | 10/2007 ............... B41J 2/161 |
| JP | 2004-179630 | | 11/2010 |
| JP | 2008-283689 | A | 8/2012 |
| WO | 02/09160 | A2 | 1/2002 |
| WO | 2005/050836 | A1 | 6/2005 |
| WO | 2009/081651 | A1 | 7/2009 |
| WO | 2011/042388 | A1 | 4/2011 |
| WO | 2012/128268 | A1 | 9/2012 |
| WO | 2013/018604 | | 2/2013 |

OTHER PUBLICATIONS

International Written Opinion for International Application No. PCT/EP2016/082259 dated Jan. 26, 2017, 6 pages.
Steichen et al., Acoustic Components Used for Filtering Review of Different Technolgies, Techniques de l'Ingenieur, E2000, (Feb. 10, 2008), 2 pages.
Japanese Notification of Reason for Rejection for Japanese Application No. 2020-202217 dated Oct. 19, 2021, 5 pages.
Chinese Notification of Re-Examination from Chinese Application No. 201680081355, dated Jul. 20, 2021, 10 pages.
Chinese Office Action for Chinese Application No. 201680081355.5, dated May 22, 2020, 4 pages.
Office Action for Japanese Application No. 2018-532615, dated Jul. 28, 2020, 6 pages.
Preliminary Report of Patentability for France Application No. 1563057, dated Sep. 8, 2016, 6 pages.
Written Opinion for Singapore Application No. 11201805403R, dated Aug. 19, 2019, 8 pages.
Chinese Decision of Rejection for Chinese Application No. 201680081355 dated Feb. 22, 2021, 5 pages.
Bartasyte et al., Residual Stresses and Clamped Termal Expansion in LiNbO3 and LiTaO3 Thin Films, Applied Physics Letters, vol. 101, (2012), pp. 122902-1-122902-5.
Chinese Office Action for CN Application No. 201680080405.8, dated Jun. 3, 2020, 13 pages.
Chinese Search Report for CN Application No. 201680080405.8, dated May 26, 2020, 2 pages.
Chinese Second Office Action for Chinese Application No. 201680081355.5, dated Nov. 6, 2020, 9 pages with English translation.
Dogheche et al., High-Frequency Surface Acoustic Wave Devices Based on LiNbO3/Diamond Multilayered structure, Applied Phys Lett, vol. 87, (2005), pp. 213503-1-213503-3.
European Communication pursuant to Article 94(3) EPC for European Application No. 16819091, dated Dec. 2, 2020, 5 pages.
European Communication pursuant to Article 94(3) EPC for European Application No. 16819558, dated Dec. 2, 2020, 4 pages.
Fukuda et al. Applied Physics Letters, vol. 28, No. 10, 1978, 575-577 (Year: 1978).
Fukuda et al., Capillary Liquid Epitaxial Growth of LiNbO3 Singlecrystal Thin Films, Applied Physics Letters 28, pp. 575-577 (1976).
Gachon, D. et al., Development of high frequency bulk acoustic wave resonator using thinned single-crystal Lithium Niobate, 2006 IEEE International Frequency Control Symposium and Exposition, Dec. 31, 2006, pp. 810-812.
Herzog, Christian, K1-yNayTa1-xNbxO3 Thins Films for Integrated Electro-Optics, Doctoral Thesis, ETH Zurich, (2007), 84 pages.
Hung et al., Epitaxial Nonlinear Optical Films of LiTaO3 Grown on GaAs in Waveguide Form, Appl. Phys. Lett., vol. 62, (1993), pp. 3071-3073.
International Search Report for International Application No. PCT/EP2016/082245 dated May 19, 2017, 2 pages.
International Written Opinion for International Application No. PCT/EP2016/082245 dated May 19, 2017, 9 pages.
Japanese Office Action for JP Application No. 2018-532582 dated Aug. 11, 2020, 5 pages with English Translation.
Saito et al., Lead-Free Piezoceramics, Nature, vol. 432, (Nov. 4, 2004), pp. 84-87.
Singapore Search Report and Written Opinion for Singapore Application No. 11201805382S, dated Aug. 19, 2019, 10 pages.
Japanese Notification of Refusal for Application No. 2020-202217 dated May 22, 2022, 4 pages.

* cited by examiner

METHOD FOR MANUFACTURING A MONOCRYSTALLINE PIEZOELECTRIC LAYER

CROSS-REFERENCE TO RELATED APPLICATIONS

This application is a national phase entry under 35 U.S.C. § 371 of International Patent Application PCT/EP2016/082259, filed Dec. 21, 2016, designating the United States of America and published as International Patent Publication WO 2017/109005 A1 on Jun. 29, 2017, which claims the benefit under Article 8 of the Patent Cooperation Treaty to French Patent Application Serial No. 1563057, filed Dec. 22, 2015.

TECHNICAL FIELD

This application relates to a method of fabricating a layer of a monocrystalline piezoelectric material, particularly for application to a microelectronic, photonic or optical device. In particular, but not in limitation, such a device may be a bulk acoustic wave device or a surface acoustic wave device for radio frequency applications.

BACKGROUND

A distinction between two main categories of filters can be made among acoustic components used for filtering in the radio frequency range:
 first, "Surface Acoustic Wave" (SAW) filters; and
 second, "Bulk Acoustic Wave" (BAW) filters and resonators.

A review of these technologies is given in the paper by W. Steichen and S. Ballandras, "Composants acoustiques utilisés pour le filtrage—Revue des différentes technologies" (Acoustic components used for filtering—Review of different technologies), Techniques de l'Ingénieur, E2000, 2008.

Surface acoustic wave filters typically comprise a thick piezoelectric layer (in other words, with a thickness usually equal to several hundred μm) and two electrodes in the form of inter-digitated combs deposited on the surface of the piezoelectric layer. An electric signal, typically a variation of an electrical voltage, applied to an electrode, is converted to an elastic wave that propagates on the surface of the piezoelectric layer. Propagation of this elastic wave is facilitated if the frequency of the wave corresponds to the frequency band of the filter. This wave is converted again into an electrical signal as it reaches the other electrode.

Bulk acoustic wave filters typically include a thin piezoelectric layer (in other words, the thickness is generally much less than 1 μm) and two electrodes formed on each main face of the thin layer. An electrical signal, typically a variation of an electrical voltage, applied to an electrode, is converted to an elastic wave that propagates through the piezoelectric layer. Propagation of this elastic wave is facilitated if the frequency of the wave corresponds to the frequency band of the filter. This wave is converted again into an electrical voltage as it reaches the electrode located on the opposite face.

In the case of surface acoustic wave filters, the piezoelectric layer must have an excellent crystalline quality so as not to cause attenuation of the surface wave. Therefore, in this case, it will be preferred to use a monocrystalline layer. At the present time, appropriate industrially usable materials are quartz, $LiNbO_3$ or $LiTaO_3$. The piezoelectric layer is obtained by cutting an ingot from one of the materials, the precision required for the thickness of the layer not being very important if the waves have to propagate essentially on the surface.

In the case of bulk acoustic wave filters, the piezoelectric layer must have a determined and uniform thickness over the entire layer, and must be precisely controlled. On the other hand, since the crystalline quality is relegated to the second order of important parameters for filter performances, compromises are currently being made concerning the crystalline quality and a polycrystalline layer has been considered to be acceptable for a long time. Therefore, the piezoelectric layer is formed by deposition on a support substrate (for example, a silicon substrate). At the present time, materials used industrially for such a deposit are AlN, ZnO and PZT.

Therefore, material choices in the two technologies are very limited.

The choice of a material is the result of a compromise between the different properties of the filter, depending on the specifications of the filter manufacturer.

It would be desirable to be able to use more materials than those listed above, to provide more freedom in the design of bulk acoustic wave filters or surface acoustic wave filters. In particular, materials traditionally used for surface acoustic wave filters could represent interesting alternatives for bulk acoustic wave filters.

However, this requires obtaining thin, uniform and good quality layers of these materials.

A first possibility would be to thin the thick layers cut from ingots, using polishing and/or etching techniques. However, these techniques cause a large loss of material and cannot achieve a layer with a thickness of a few hundred nanometers with the required uniformity.

A second possibility would be to use a SMART CUT® type layer transfer by creating a zone of weakness in a donor substrate of quartz, $LiNbO_3$ or $LiTaO_3$ so as to delimit the thin layer to be transferred, by bonding the layer to be transferred to a support substrate and detaching the donor substrate from it along the zone of weakness so as to transfer the thin layer onto the support substrate. However, creation of the zone of weakness by ion implantation in the donor substrate damages the transferred layer and deteriorates its piezoelectric crystals. Curing methods (particularly baking) known for the transfer of silicon layers are not always capable of completely repairing the piezoelectric layer, due to the complex crystalline structure of the layer and damage mechanisms that seem to be different from mechanisms that occur in silicon.

Finally, at the present time, there is no appropriate substrate, particularly with an appropriate lattice parameter, to form a monocrystalline thin layer made of quartz, $LiNbO_3$ or $LiTaO_3$ by heteroepitaxy with sufficient quality, even if several tests have been carried out on substrates such as sapphire.

BRIEF SUMMARY

One purpose of the disclosure is to overcome the above-mentioned disadvantages and particularly to design a method of fabricating a substrate for a microelectronic, photonic or optical device, particularly, but not in limitation, a bulk acoustic wave device or a surface acoustic wave device from a wider range of materials, and particularly such that uniform thin layers can be obtained (in other words less than 20 μm thick, or even less than 1 μm thick) of materials used for surface acoustic wave devices. Moreover, this method must also make it possible to use a wider variety of support substrates than is possible in existing bulk acoustic wave devices.

The disclosure describes a method of fabricating a layer of a monocrystalline piezoelectric layer, wherein the method comprises:

the supply of a donor substrate of piezoelectric material,
the supply of a receiving substrate,
the transfer of a layer called a "seed layer" from the donor substrate onto the receiving substrate,
implementation of an epitaxy of the piezoelectric material on the seed layer until the required thickness for the monocrystalline piezoelectric layer is obtained.

According to one embodiment, the transfer of the seed layer includes the following steps:

formation of a zone of weakness in the donor substrate so as to delimit the seed layer to be transferred,
bonding of the donor substrate onto the receiving substrate, the seed layer to be transferred being at the interface,
detachment of the donor substrate along the zone of weakness so as to transfer the seed layer onto the receiving substrate.

The zone of weakness can be formed by ion implantation in the donor substrate.

Preferably, the piezoelectric material is chosen from among quartz and compounds with the formula $LiXO_3$, in which X is chosen from among niobium and tantalum.

Advantageously, the thickness of the seed layer is less than 2 μm, and preferably less than 1 μm.

According to one embodiment, before the epitaxy step, part of the thickness of the seed layer transferred onto the receiving substrate is removed.

Advantageously, the thickness of the monocrystalline piezoelectric layer at the end of the epitaxy step is between 0.2 and 20 μm.

According to one embodiment, at least one electrically insulating layer and/or at least one electrically conducting layer is/are formed at the interface between the receiving substrate and the seed layer.

According to one particular embodiment, the method includes the transfer of at least part of the monocrystalline piezoelectric layer to a final substrate, after epitaxy.

Advantageously, the method includes removal of the seed layer, after the transfer onto the final substrate.

Advantageously, the receiving substrate is made of a semiconducting material and it includes an intermediate trap rich layer located between the seed layer and the receiving substrate.

Another purpose relates to a substrate for a microelectronic, photonic or optical device, comprising a monocrystalline piezoelectric layer on a receiving substrate, wherein the piezoelectric layer has a first portion located at the interface with the receiving substrate, and a second portion extending from the first portion and wherein the characteristics of the second portion are different from those of the first portion.

Another purpose relates to a method of manufacturing a bulk acoustic wave device, comprising the formation of electrodes on two main faces opposite a piezoelectric layer, wherein the method comprises fabrication of the piezoelectric layer using a method like that described above.

Another purpose relates to a bulk acoustic wave device comprising a piezoelectric layer that can be obtained by a method like that described above, and two electrodes arranged on two principal opposite faces of the layer.

Another purpose relates to a method of manufacturing a surface acoustic wave device, comprising the formation of two inter-digitated electrodes on the surface of a piezoelectric layer, wherein the method comprises fabrication of the piezoelectric layer using a method as described above.

Another purpose relates to a surface acoustic wave device comprising a piezoelectric layer that can be obtained by a method like that described above, and two inter-digitated electrodes arranged on one face of the piezoelectric layer.

BRIEF DESCRIPTION OF THE DRAWINGS

Other characteristics and advantages of the disclosure will become clear after reading the following detailed description, with reference to the accompanying drawings in which.

The illustrated elements are not necessarily drawn to scale to improve the readability of the figures. Furthermore, elements designated with the same reference numbers on the different figures are identical.

DETAILED DESCRIPTION

Figure 1:
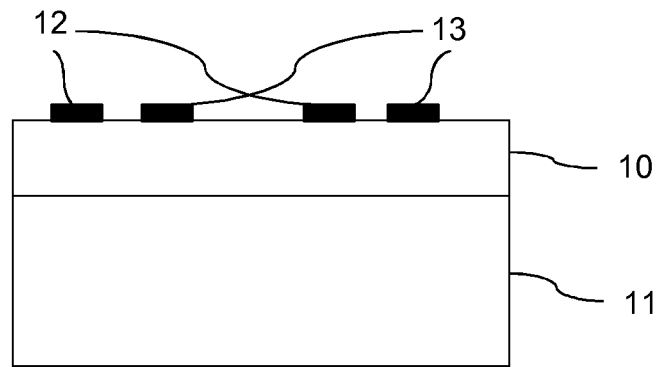
FIG. 1 is a principle cross-sectional view of a surface acoustic wave filter.

FIG. 1 is a principle view of a surface acoustic wave filter.

The filter comprises a piezoelectric layer 10 and two electrodes 12, 13 in the form of two inter-digitated metal combs deposited on the surface of the piezoelectric layer. On the side opposite the electrodes 12, 13, the piezoelectric layer is supported on a support substrate 11. The piezoelectric layer 10 is monocrystalline, an excellent crystalline quality being preferable so as not to cause any attenuation of the surface wave.

Figure 2:
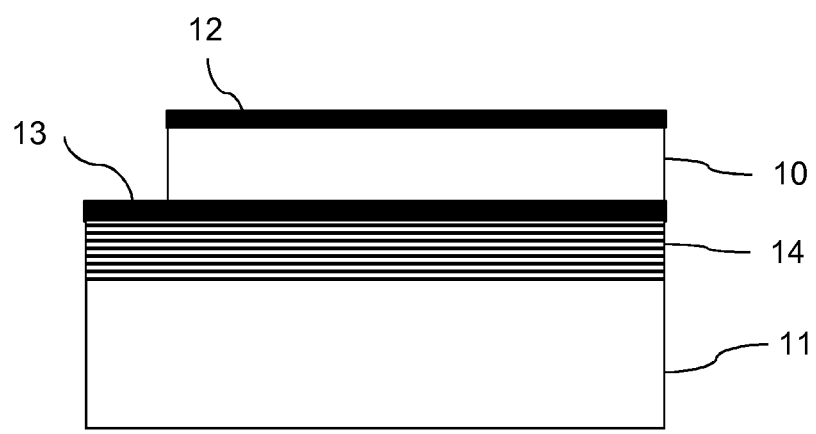
FIG. 2 is a principle cross-sectional view of a bulk acoustic wave filter.

FIG. 2 is a principle cross-sectional view of a bulk acoustic wave resonator.

The resonator comprises a thin piezoelectric layer (in other words, with a thickness generally less than 2 μm, and preferably less than 0.2 μm) and two electrodes 12, 13 laid out on each side of the piezoelectric layer 10 that, due to the fabrication method according to the disclosure, is monocrystalline. The piezoelectric layer 10 rests on a support substrate 11. Optionally, the resonator of the substrate can be isolated, thus preventing the propagation of waves in the substrate, by inserting a Bragg mirror 14 between the electrode 13 and the substrate 11. Alternatively (not illustrated), this isolation could be achieved by forming a cavity between the substrate and the piezoelectric layer. These different arrangements are known to an expert in the subject and, therefore, will not be described in detail in this text.

In general, the disclosure describes the formation of the monocrystalline piezoelectric layer by means of a transfer of a monocrystalline seed layer for the piezoelectric material considered, the transfer being made from a donor substrate of the piezoelectric material to a receiving substrate. An epitaxy is then made on the seed layer until the required thickness for the monocrystalline piezoelectric layer is obtained.

The donor substrate may be a solid monocrystalline substrate of the piezoelectric material considered. Alternatively, the donor substrate may be a composite substrate, in other words, formed from a stack of at least two layers of different materials, of which a surface layer is composed of the monocrystalline piezoelectric material.

One function of the receiving substrate is to provide mechanical support for the seed layer. It may be adapted in any manner to implement an epitaxy (particularly in terms of holding the temperature) and advantageously, but not necessarily, adapted to the target application. It may be solid or composite.

At least one intermediate layer may possibly be intercalated between the receiving substrate and the seed layer. For example, such an intermediate layer may be electrically conducting or electrically insulating. An expert in the subject will be capable of choosing the material and the thickness of this layer as a function of the properties that he would like to confer on the radio frequency device that will include the piezoelectric layer.

Advantageously, the receiving substrate may be a semiconducting material. For example, it may be a silicon substrate. This conducting material comprises a "trap-rich" type intermediate layer that can either be formed on the receiving substrate, or formed on the surface of the receiving substrate. The trap-rich type intermediate layer is thus located between the seed layer and the receiving substrate and can improve the electrical insulation performances of the receiving substrate. The trap-rich type intermediate layer may be formed by a polycrystalline, amorphous or porous type material, and particularly polycrystalline silicon, amorphous silicon or porous silicon, without being limited to these materials. Furthermore, depending on the temperature resistance of the trap-rich type intermediate layer for making the epitaxy, it may be advantageous to introduce an additional layer between the receiving substrate and the trap-rich type intermediate layer to prevent recrystallization of this layer during a heat treatment.

The function of the seed layer is to impose the mesh parameter of the crystalline material that is to be grown on the receiving substrate. The thickness of the seed layer is negligible compared with the thickness of the monocrystalline piezoelectric layer. Consequently, it is considered that it has no significant influence on operation of the radio frequency device incorporating the monocrystalline piezoelectric layer.

The thickness of the seed layer is typically less than 1 µm, and preferably less than 0.2 µm.

The thickness of the epitaxial layer depends on the specifications of the device that will incorporate the monocrystalline piezoelectric layer. In this respect, there is no limiting minimum value or maximum value of the thickness of the epitaxial layer. The thickness of the final piezoelectric layer is typically between 0.2 µm and 20 µm.

The following table gives combinations of the thickness of the seed layer and the epitaxial layer, for information purposes:

| Seed layer | 0.5 µm | 0.05 µm | 0.1 µm | 0.03 µm |
|---|---|---|---|---|
| Epitaxial layer | 2.5 µm | 0.95 µm | 5 µm | 0.15 µm |

Advantageously, the piezoelectric material is made of quartz or a compound with the formula $LiXO_3$, in which X is chosen from among niobium and tantalum. However, the advantages of these materials are not limited to their piezoelectric nature. In particular, for other applications, for example, related to integrated optics, it could also be possible to consider them for their dielectric permittivity, their refraction indexes or for their pyroelectric, ferroelectric or ferromagnetic properties, depending on the case.

Thus, in particular, the disclosure can be used to form a thin layer of an $LiXO_3$ compound that has an excellent crystalline quality, as solid substrates for these materials, with a controlled thickness within a wide range of frequencies, and particularly a thickness less than 20 µm.

The epitaxy can be done using any appropriate technique, in particular, by "Chemical Vapor Deposition" (CVD), "Liquid Phase Epitaxy (LPE), "Pulsed Laser Deposition" (PLD), etc.

A person of ordinary skill in the art will be capable of determining the reagents and operating conditions as a function of the piezoelectric material to be grown and the technique chosen.

The transfer of the seed layer typically involves a step in which the donor substrate and the receiving substrate are bonded, the seed layer being at the bonding interface, followed by a thinning step of the receiving substrate so as to expose the seed layer ready for subsequent epitaxy.

The bonding step may, for example, be done by direct "wafer bonding" type molecular bonding, with or without an additional intermediate layer.

Particularly advantageously, the transfer is made using the SMART CUT® method that is well known for the transfer of thin semiconducting layers, particularly silicon.

Figure 3A:
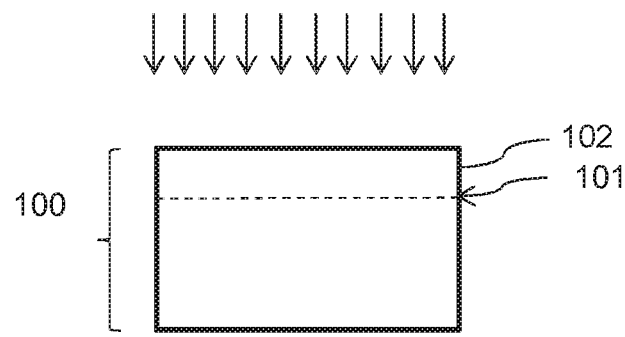
FIGS. 3A to 3E illustrate successive steps in a method of fabricating a monocrystalline piezoelectric layer according to one embodiment of the disclosure.

To achieve this, with reference to FIG. 3A, a donor substrate 100 of the piezoelectric material is supplied and a zone of weakness 101 is formed by ion implantation (shown diagrammatically by the arrows), that delimits a monocrystalline piezoelectric layer 102 to be transferred and that will form the seed layer. The donor substrate 100 is shown as being solid on this figure, but as mentioned above, could possibly be composite. Advantageously, and depending on the piezoelectric material considered ($LiNbO_3$, $LiTaO_3$ or quartz) the implanted species are hydrogen or helium, alone or in combination. A person of ordinary skill in the art is capable of determining the dose and implantation energy of these species to form a zone of weakness at a determined depth, that is typically less than 2 µm: typically and still depending on the piezoelectric material and the implanted species considered, the dose is within the 2 E+16 to 2 E+17 ion species/$cm^2$ range, and the implantation energy is 30 keV to 500 keV. The buried zone of weakness may also be obtained by any other means known to a person of ordinary skill in the art, for example, by increasing the porosity of the material, or by laser irradiation.

Figure 3B:
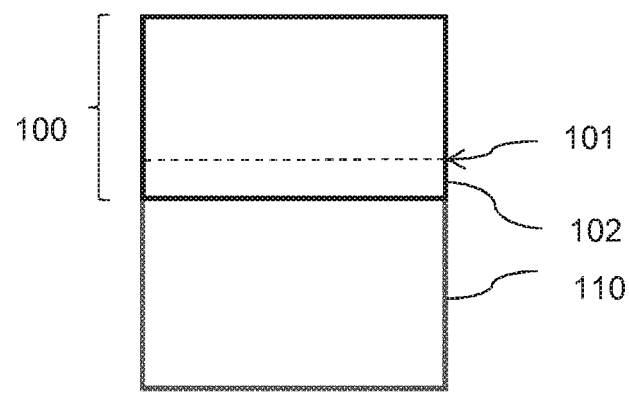

With reference to FIG. 3B, the donor substrate 100 thus weakened is bonded to the receiving substrate 110, the surface of the donor substrate through which the implantation was made being at the bonding interface. Possibly, before bonding, the donor substrate and/or the receiving substrate may be covered with an electrically insulating layer, for example, $SiO_2$, or an electrically conducting layer (not shown) that is intercalated between the receiving substrate and the seed layer after the transfer.

Figure 3C:
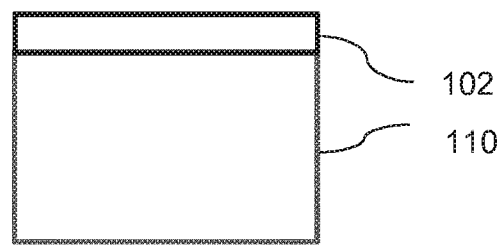

Referring to FIG. 3C, the donor substrate 100 is detached along the zone of weakness 101. Such a detachment can be provoked by any method known to an expert in the subject, for example, thermal, mechanical, chemical, etc. The remaining donor substrate is then recovered and can possibly be recycled, so that the layer 102 can be transferred onto the receiving substrate 110.

Figure 3D:
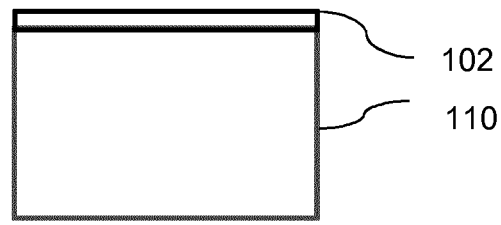

With reference to FIG. 3D, a superficial part of the transferred layer can optionally be removed, for example, by mechanical polishing and/or by chemical etching. The purpose of this removal is to eliminate any defects related to implantation and detachment. The result obtained at the end of this removal is a thinned layer 102 on the receiving substrate 110 that will be used as a seed layer for the next step. Alternatively, the transferred layer 102 in FIG. 3C can be used directly as a seed.

Figure 3E:
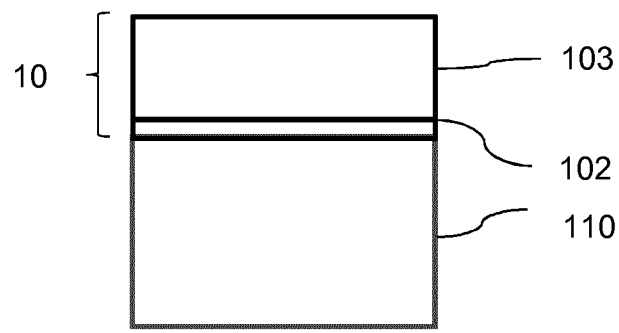

With reference to FIG. 3E, a monocrystalline piezoelectric layer 103 is grown by epitaxy on the seed layer 102, the material of the epitaxial layer 103 being practically the same as the material of the seed layer 102. Thus, the seed layer 102 imposes its mesh parameter and enables growth of a good quality monocrystalline material. The nature of the epitaxial layer may be slightly different from the seed layer 102, particularly as a result of the controlled introduction of small levels of impurities for various purposes (doping, adjustment of piezoelectric properties, optimization of densities of crystalline defects/dislocations, surfactant, etc.). Growth is stopped when the required thickness for the monocrystalline piezoelectric layer is reached. The final piezoelectric layer 10 is formed from the stack of the seed layer 102 and the epitaxial layer 103.

As mentioned above, the seed layer is considered as having no effect or a second order effect on operation of a radio frequency device incorporating the epitaxial piezoelectric layer. Consequently, even if the implantation made for implementation of the SMART CUT® process damages the layer and disturbs its piezoelectric properties, these defects are not penalizing or are only slightly penalizing.

As an alternative (not illustrated) to the SMART CUT® process, the transfer can be made after bonding of the donor substrate and the receiving substrate, by removal of material, for example, by mechanical polishing and/or chemical etching of the donor substrate until the seed layer is exposed. This variant is less advantageous in that it involves a consumption of the donor substrate, while the SMART CUT® process enables recycling of the donor substrate, if required. On the other hand, this variant does not require any implantation within the donor substrate.

As can be seen on FIG. 3E, the result obtained at the end of the process is a substrate for a surface acoustic wave device or a bulk acoustic wave device that comprises a receiving substrate 110 and a monocrystalline piezoelectric layer 10 on the receiving substrate 110. Such a substrate can also be useful for other applications, for example, for photonics and the integrated optics.

The layer 10 is characterized by the presence of two portions with different characteristics:
- a first portion 102 located at the interface with the receiving substrate 110, corresponding to the seed layer,
- a second portion (103) extending from the first portion 102, corresponding to the epitaxial layer, that has a different crystalline quality than the first portion, the quality being adjustable and possibly optimized during the epitaxy step (particularly in order to obtain better quality on the seed layer) and/or a different composition (particularly if impurities were introduced during the epitaxy), possibly conferring particular properties on the epitaxial layer.

This substrate is advantageously used to fabricate a surface acoustic wave device like that illustrated on FIG. 1 or a bulk acoustic wave device like that illustrated on FIG. 2, or any other microelectronic, photonic or optical device comprising a piezoelectric layer.

Figure 3F:
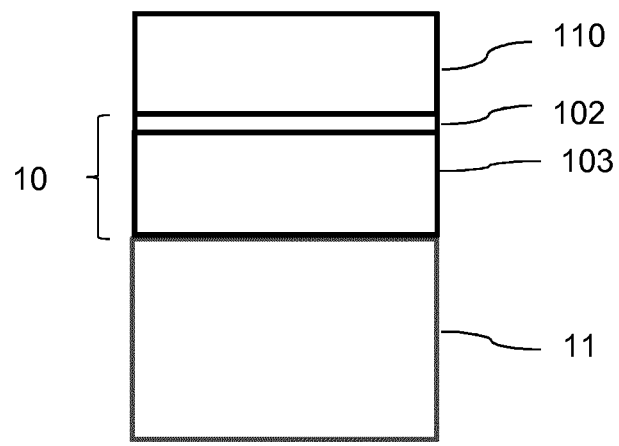
FIGS. 3F to 3H illustrate subsequent optional steps of the method.
Figure 3G:
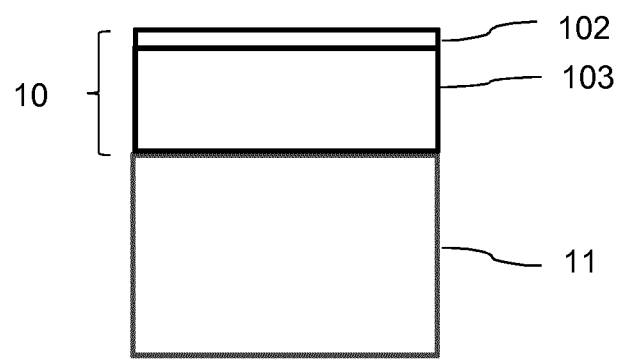
Figure 3H:
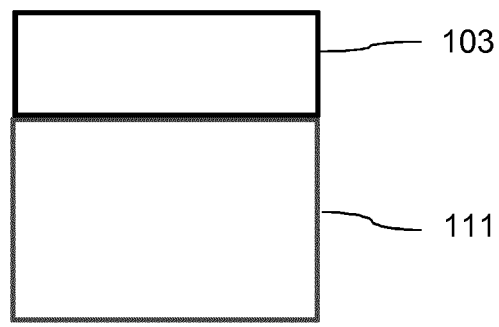

In some cases, the receiving substrate on which epitaxial growth takes place may not be optimal for the final application. Since the receiving substrate will have to be subjected to operating conditions of the epitaxy, the choice of appropriate materials is limited. In particular, the receiving substrate cannot contain any layers or elements that could be damaged by the epitaxy temperature. It may then be advantageous to transfer the piezoelectric layer 10 on a final substrate 111 for which the properties are chosen as a function of the target application, by bonding it onto the substrate 111 through the surface of the epitaxial layer 103 (see FIG. 3F), and removing the receiving substrate (see FIG. 3G). This transfer can be made by any of the transfer techniques mentioned above. Another advantage of this transfer onto a final substrate is that the seed layer 102, that was buried in the structure obtained after the epitaxy, is then exposed and can possibly be removed (see FIG. 3H), particularly if there are any defects in it. Only the epitaxial layer 103 (or part of the layer) with the required characteristics then remains on the final substrate 111.

If it is required to fabricate a surface acoustic wave device, metal electrodes 12, 13 in the form of two interdigitated combs are deposited on the surface of the piezoelectric layer 10 opposite the receiving substrate or possibly on the final substrate (regardless of whether it is the receiving substrate 110 or the final substrate 111, the substrate forms the support substrate denoted 11 on FIG. 1).

The method described above will have to be adapted if it is required to fabricate a bulk acoustic wave device. First, a first electrode is deposited on the free surface of the layer 102 to be transferred from the piezoelectric donor substrate, before the bonding step illustrated in FIG. 3B, this first electrode (reference 13 on FIG. 2) being buried in the final stack. After the epitaxial growth step illustrated on FIG. 3E, a second electrode (reference 12 on FIG. 2) is deposited on the free surface of the piezoelectric layer 10, opposite the first electrode. Another option is to transfer the piezoelectric layer onto a final substrate as mentioned above and to form the electrodes before and after the transfer. Second, and optionally, an insulation means, for example, such as a Bragg mirror 14 (as illustrated on FIG. 2) or a cavity possibly previously etched in the substrate 110 or in the final substrate 111, can be incorporated into the receiving substrate 110 to prevent propagation of acoustic waves in this receiving substrate.

Another application field that is particularly concerned by the development of such piezoelectric material solutions is the field of micro-sensors and micro-actuators. The objective for micro-sensors will generally be to measure a deformation generated by an external action. On the contrary, the objective for micro-actuators will be to generate the deformation of an element or displacement of a mobile part through the application of a continuous or variable electric field. Use of the piezoelectric material can relate to mechanical deformation and electrical signal. For example, in acoustics, the external action is a pressure wave that deforms a membrane. It may be in the audible spectrum, and objects typically concerned are microphones (in sensor mode) and loudspeakers (in actuator mode). It may go further in frequency, for example, for the manufacture of Piezo Micromachined Ultrasonic Transducers (PMUT). It can also relate to static pressure sensors or even inertial sensors (acceleration sensors, gyroscopes, etc.) for which the displacement of a mobile mass moved by an applied acceleration is measured using the piezoelectric material. The piezoelectric material forms the entire deformed element (membrane, beam, cantilever, etc.) or advantageously only part of it by stacking it with other materials, for example, such as silicon, to better obtain the mechanical properties of the deformable part. In the actuators category, the piezoelectric materials can control a very precise displacement and are used, for example, to expel ink from print cartridges, or for microfluidic systems, or to adjust a focal distance of an optical microsystem.

REFERENCES

W. Steichen and S. Ballandras, "Composants acoustiques utilisés pour le filtrage—Revue des différentes technologies" (Acoustic components used for filtering—Review of different technologies), Techniques de l'Ingénieur, E2000, 2008.

The invention claimed is:

1. A method of fabricating a monocrystalline piezoelectric layer, comprising:
    providing a donor substrate comprising a piezoelectric material;
    providing a receiving substrate;
    transferring a seed layer from the donor substrate onto the receiving substrate, wherein the transferring comprises the following steps:
        forming a zone of weakness in the donor substrate by implanting ions into the donor substrate so as to delimit the seed layer to be transferred;
        bonding the donor substrate onto the receiving substrate, the seed layer to be transferred being at an interface between the donor substrate and the receiving substrate; and
        detaching the donor substrate along the zone of weakness so as to transfer the seed layer onto the receiving substrate; and
    epitaxially growing the piezoelectric material on the seed layer to form the monocrystalline piezoelectric layer until the monocrystalline piezoelectric layer has a predetermined thickness.

2. The method of claim 1, wherein the piezoelectric material comprises quartz or a compound with the formula $LiXO_3$, in which X is selected from among niobium and tantalum.

3. The method of claim 1, wherein a thickness of the seed layer is less than 2 μm.

4. The method of claim 1, further comprising forming at least one electrically insulating layer and/or at least one electrically conducting layer at the interface between the receiving substrate and the seed layer.

5. The method of claim 1, wherein the predetermined thickness of the monocrystalline piezoelectric layer is between 0.2 and 20 μm.

6. The method of claim 1, wherein the receiving substrate comprises a semiconducting material and includes a trap rich layer located between the seed layer and a remaining portion of the receiving substrate.

7. The method of claim 1, wherein:
    the piezoelectric material comprises quartz or a compound with the formula $LiXO_3$, in which X comprises at least one element selected from among niobium and tantalum;
    a thickness of the seed layer is less than 2 μm; and
    the predetermined thickness of the monocrystalline piezoelectric layer is between 0.2 and 20 μm.

8. The method of claim 7, further comprising forming at least one electrically insulating layer and/or at least one electrically conducting layer at the interface between the receiving substrate and the seed layer.

9. The method of claim 1, further comprising forming electrodes on two main opposing faces of the monocrystalline piezoelectric layer and forming a bulk acoustic wave device using the monocrystalline piezoelectric layer.

10. The method of claim 1, further comprising forming two inter-digitated electrodes on a surface of the monocrystalline piezoelectric layer and forming a surface acoustic wave device using the monocrystalline piezoelectric layer.

11. A method of fabricating a monocrystalline piezoelectric layer, comprising:
    providing a donor substrate comprising a piezoelectric material;
    providing a receiving substrate;
    transferring a seed layer from the donor substrate onto the receiving substrate;
    removing a portion of the thickness of the seed layer after transferring the seed layer onto the receiving substrate; and
    after removing the portion of the thickness of the seed layer, epitaxially growing the piezoelectric material on the seed layer to form the monocrystalline piezoelectric layer until the monocrystalline piezoelectric layer has a predetermined thickness.

12. A method of fabricating a monocrystalline piezoelectric layer, comprising:
    providing a donor substrate comprising a piezoelectric material;
    providing a receiving substrate;
    transferring a seed layer from the donor substrate onto the receiving substrate;
    epitaxially growing the piezoelectric material on the seed layer to form the monocrystalline piezoelectric layer until the monocrystalline piezoelectric layer has a predetermined thickness;
    transferring at least a portion of the monocrystalline piezoelectric layer to a final substrate after epitaxially growing the piezoelectric material on the seed layer to form the monocrystalline piezoelectric layer; and
    removing the seed layer after transferring the at least a portion of the monocrystalline piezoelectric layer to the final substrate.

* * * * *